(12) United States Patent
Zozgornik

(10) Patent No.: US 10,520,152 B2
(45) Date of Patent: Dec. 31, 2019

(54) LASER-BASED LIGHT SOURCE WITH LIGHT EMISSION CONTROL

(71) Applicant: Lumileds Holding B.V., Schipol (NL)

(72) Inventor: Steffen Zozgornik, Aachen (DE)

(73) Assignee: LUMILEDS HOLDING B.V., Schiphol (NL)

( * ) Notice: Subject to any disclaimer, the term of this patent is extended or adjusted under 35 U.S.C. 154(b) by 119 days.

(21) Appl. No.: 15/773,121

(22) PCT Filed: Oct. 24, 2016

(86) PCT No.: PCT/EP2016/075557
§ 371 (c)(1),
(2) Date: May 2, 2018

(87) PCT Pub. No.: WO2017/076679
PCT Pub. Date: May 11, 2017

(65) Prior Publication Data
US 2018/0320851 A1 Nov. 8, 2018

(30) Foreign Application Priority Data
Nov. 5, 2015 (EP) .................... 15193196

(51) Int. Cl.
*G02B 27/20* (2006.01)
*F21S 41/135* (2018.01)
*H01S 3/00* (2006.01)
*H01S 5/00* (2006.01)
*H01S 5/40* (2006.01)
(Continued)

(52) U.S. Cl.
CPC ............ *F21S 41/135* (2018.01); *F21S 41/125* (2018.01); *F21S 41/16* (2018.01); *F21S 41/683* (2018.01); *F21V 7/26* (2018.02); *F21V 9/14* (2013.01); *F21V 9/30* (2018.02); *F21V 9/40* (2018.02); *F21V 14/08* (2013.01); *H01S 3/005* (2013.01); *H01S 3/23* (2013.01); *H01S 5/005* (2013.01); *H01S 5/4012* (2013.01)

(58) Field of Classification Search
CPC ............ F21S 41/125–135; F21S 41/16; F21S 41/68–683; F21V 7/00–30; F21V 9/00–45; F21V 14/08; H03S 3/005; H03S 3/23; H03S 5/005; H03S 5/4012
USPC ......... 362/227–240, 259, 509–510, 543–549
See application file for complete search history.

(56) References Cited

U.S. PATENT DOCUMENTS

2012/0320583 A1 12/2012 Van Bommel et al.
2013/0176705 A1 7/2013 Ohta

FOREIGN PATENT DOCUMENTS

DE 102010062463 6/2012

*Primary Examiner* — Jason M Han
(74) *Attorney, Agent, or Firm* — Volpe and Koenig, P.C.

(57) ABSTRACT

The invention describes a laser-based light source (100) which is adapted to use the angular dependence of the reflection of polarized laser light (10) at a surface of a conversion material to control especially the color point of light emitted by means of the laser-based light source (100). The reflected laser light is within a first wavelength range and the converted light is in a second wavelength range different from the first wavelength range such that the color point of the light emitted by means of the laser-based light source (100) in a defined solid angle depends on the ratio between reflected and converted light. The invention further describes a corresponding method of light emission control, a vehicle headlight (200) comprising such a laser-based light source (100) and a lighting system comprising such vehicle headlights (200).

16 Claims, 7 Drawing Sheets

(51) Int. Cl.
*H01S 3/23* (2006.01)
*F21S 41/16* (2018.01)
*F21S 41/125* (2018.01)
*F21S 41/683* (2018.01)
*F21V 9/30* (2018.01)
*F21V 7/26* (2018.01)
*F21V 9/40* (2018.01)
*F21V 9/14* (2006.01)
*F21V 14/08* (2006.01)

LASER-BASED LIGHT SOURCE WITH LIGHT EMISSION CONTROL

FIELD OF THE INVENTION

The invention relates to a laser-based light source with light emission manipulation or control especially color point adjustment and a related method of light emission manipulation or control especially color point adjustment. The invention further relates to a vehicle headlight comprising such a laser-based light source and a lighting system comprising such vehicle headlights.

BACKGROUND OF THE INVENTION

DE102010062463 (A1) discloses a lighting-device which has two phosphor regions that can be individually illuminated by respective light sources. The light sources are designed as narrow beam light sources, i.e. blue lasers. The lasers are designed as solid state lasers or laser diodes. The phosphor regions are aligned for partially converting wavelength of incident light, and for diffuse radiation of the light on downstream optical elements i.e. reflectors, where the optical elements exhibit different optical properties. The phosphor regions are mounted on a cooling body. The color of the emitted light can be adjusted by means of the two phosphor regions.

SUMMARY OF THE INVENTION

It is an object of the present invention to provide a laser-based light source especially a laser-based headlight with improved and/or simplified emission manipulation or control especially color point adjustment.

According to a first aspect a laser-based light source is provided. The laser-based light source comprises one or more lasers, at least one conversion device and at least one manipulation device. The one or more lasers are adapted to emit first laser light. The first laser light comprises linearly polarized laser light with a first polarization component parallel to a plane of incidence of the first laser light with respect to a first surface of the conversion device and a second polarization component perpendicular to the plane of incidence. The conversion device is adapted to convert a first part of the first laser light to first light and to reflect a second part of the first laser light at the first surface of the conversion device. The first light is in a different wavelength range as the first laser light. The wavelength ranges may overlap. The manipulation device is arranged to manipulate or control a first intensity of the first part and a second intensity of the second part using an angular dependence of the reflection of the first and the second polarization component of the first laser light at the first surface of the conversion device.

The laser-based light source is especially arranged to manipulate or control color of the light emitted by the laser-based light source. The manipulation device may be arranged to receive external control signals in order to manipulate the color of the light emitted by the laser-based light source. The manipulation device may be arranged to perform the manipulation by controlling the color of the light emitted by the laser-based light source based on feedback information evaluated by the manipulation device.

The basic principle used to manipulate or control, for example, the color or more precise color distribution is the dependence of the reflection of polarized laser light at the surface of the conversion device. The reflection of the first laser light at the surface of the conversion device depends on the direction of polarization with respect to the plane of incidence and the angle between the first laser light and the optical axis of the conversion device or the respective part of the conversion device at the point of reflection of the first laser light. It is thus possible to manipulate or control the reflection ratio by means of changing the direction of polarization, the ratio of the intensities of the polarization components and/or the angle of incidence of the first laser light at the surface of the conversion device.

The plane of incidence is the plane which contains the surface normal and the propagation vector of the incoming first laser light. In wave optics, the latter is the k-vector, or wave vector, of the incoming wave of the first laser light.

The conversion device may comprise a conversion element, a mounting structure, a heat sink and optionally a reflective structure. The conversion device may comprise a conversion element comprising a phosphor for converting, for example, at least a part of blue first laser light to yellow first light. The phosphor may, for example, be a ceramic block of Cerium doped Yttrium-Aluminium-Granat (YAG). One of the surfaces of the ceramic block may be the or one of the first surfaces of the conversion device.

The laser-based light source may comprise at least a first laser and a second laser, wherein the first laser and the second laser are adapted to emit the first laser light.

The laser-based light source may comprise two, three, four or more lasers or an array of lasers especially blue solid state lasers. Solid state lasers or laser diodes as, for example, side emitting solid state lasers emit polarized laser light. Two or more of such solid-state lasers can be easily aligned such that the whole arrangement emits polarized laser light, wherein each laser beam comprises laser light of the same polarization direction. Alternatively or in addition may lasers be used emitting laser light with different polarization direction. The laser light with different polarization may be directed to the same conversion element. The color of the light emitted by means of the laser-based light source may be manipulated or controlled by means of the manipulation device by manipulating or controlling the intensity of the lasers emitting the laser light with the different polarization in an individual way. The manipulation device may in this case be, for example, a power controller which is arranged to provide different electrical power to the at least two lasers emitting laser light with different polarization. The same approach may be used if the first and the second laser emit laser light with the same polarization but at different angles of incidence with respect to the first surface or surfaces of the conversion device. The angular dependence of the reflection may be used to manipulate or control the color of the light emitted by means of the laser-based light source by means of the electrical power provided by the manipulation device.

The polarized laser light (first laser light) may be either directly emitted to the conversion device or alternatively optical devices like lenses, reflectors, active optical elements and the like may be used to direct the first laser light to the intended surface of the conversion device. The manipulation device may comprise any electrical, mechanical, optical or electro-optical arrangement or combinations thereof which can be used to change the direction of polarization and/or the angle of incidence of the first laser light.

The first surface or the first surfaces of the conversion device may preferably be adapted to match a first main emission direction of the first light to a second main emission direction of the second part of the first laser light. The first surface or surfaces of the conversion device may comprise a structure and/or coating which enables convergence of the reflected second part of the first laser light and the first light emitted from the first surface of the conversion device. The surface of the converting phosphor or conversion element which may be comprised by the conversion device emits the converted first part of the first laser light in accordance with Lambert's emission law. The intensity of the converted first part is proportional to the cosine of the angle with respect to the optical axis of the first surface of the conversion device which emits the converted first light. The reflected second part of the first laser light is reflected in accordance with the reflection law. There is thus a mismatch between the main directions of emission which is along the optical axis with respect to the first surface for the converted first part of the first laser light and which is at the reflection angle for the reflected second part of the first laser light. The reflection angel is thus preferably small especially smaller as the Brewster angle of the first surface of the conversion device. The first surface of the conversion device may further comprise, for example, a surface grating for influencing the reflection angle of the reflected second part of the first laser light such that angle between the main emission direction of the converted first part of the laser light and the reflected second part of the first laser light is reduced. The laser-based light source may further comprise optical devices or elements as lenses or reflectors which may be used to improve convergence of the first light and reflected first laser light.

The laser-based light source may comprise a first laser, wherein the first laser is adapted to emit the first laser light.

The manipulation device may be arranged to manipulate or control the first intensity of the first part and the second intensity of the second part by changing a ratio between the first polarization component and the second polarization component. The ratio between the first polarization component and the second polarization component may be changed by turning the first laser or the arrangement comprising the first laser or by means of corresponding optical devices which can be used to turn the polarization direction.

The manipulation device may comprise a controller and an optical manipulation device. The optical manipulation device may comprise a half wave plate and a rotation unit. The controller may be adapted to change the ratio between the first polarization component and the second polarization component by rotating the half wave plate by means of the rotation unit. Rotation of the half wave plate with respect to the polarization direction of the first laser light emitted by the at least one first laser is used in order to rotate or turn the polarization direction. The ratio of the first polarization component and the second polarization component received at the first surface of the conversion device can therefore be controlled by means of the controller. Furthermore, two or more lasers may be used wherein the polarization direction and/or the intensity of the emitted laser light can be individually controlled by means of the controller. The color of the light emitted by the laser-based light source may be adapted by controlling the intensities and/or the ratios of the respective first polarization components and second polarization component of the different lasers.

The manipulation device may comprise according to an alternative embodiment a controller and an optical manipulation device. The optical manipulation device may comprise an electro-optical rotator. The controller may be adapted to change the ratio between the first polarization component and the second polarization component by means of the electro-optical rotator. Such an electro-optical rotator may, for example, be a liquid-crystal polarization rotator which can continuously rotate the polarization orientation of the first laser light. The controller adapts the ratio between the first polarization component and the second polarization component by applying different electrical voltages to the liquid-crystal polarization rotator.

The manipulation device may alternatively comprise a controller and a first movement unit mechanically coupled to the one or more lasers (e.g. the first laser). The controller is adapted to change the ratio between the first polarization component and the second polarization component by moving the one or more lasers by means of the first movement unit.

The manipulation device may alternatively or in addition be arranged to manipulate or control the first intensity of the first part and the second intensity of the second part by changing an angle of incidence of the first laser light with respect to the first surface or surfaces of the conversion device.

The manipulation device may comprise a controller and a first movement unit mechanically coupled to one or more lasers (e.g. the first laser). The controller may be adapted in this case to change the angle of incidence of the first laser light by moving the first laser by means of the first movement unit. The first movement unit may be adapted to move the first laser or the laser arrangement comprising the first laser around an axis which may be the orthogonal to the optical axis of the first laser or the laser arrangement.

The manipulation device may alternatively comprise a controller and a second movement unit mechanically coupled to the conversion device. The controller may be adapted in this case to change the angle of incidence of the first laser light with respect to the first surface of the conversion device by moving the first surface of the conversion device by means of the second movement unit. The second movement unit may be adapted to move the first surface or the conversion device around an axis which may be orthogonal to the first surface or at least one optical axis of the conversion device.

The laser-based light source may further comprise at least one optical sensor. The optical sensor may be arranged to measure a brightness and/or color of the first light and the reflected second part of the first laser light in at least one predefined solid angle in a light emission direction of the laser-based light source. The manipulation device may be adapted to receive measurement signals based on the brightness and/or color measured by the optical sensor. The manipulation device may be arranged to manipulate or control the first intensity of the first part and the second intensity of the second part based on the received measurement signals.

The emission characteristics of the laser-based light source may strongly depend on the solid angle with respect to the light emission direction of the laser-based light source. It may thus be preferred to use two, three, four or more optical sensors at different predefined solid angle in order to optimize the emission characteristics of the mixture of the reflected second part and the first light for a broad emission angle. Alternatively or in addition it may be possible to determine the emission characteristics based on the measurement of only one optical sensor if the control device comprises, for example, a processor and memory device which is adapted to determine the emission characteristic based on measurement data provided by the one optical sensor. Simulation data may be used to determine the emission characteristics within a defined range of emission angles. Alternatively or in addition may it be possible to store corresponding data in a list such that the manipulation device controls the intensity and/or color distribution of the light emitted by the laser-based light source by means of control parameters stored in the list. At least two optical sensors at different solid-state angles may be preferred in order to determine, for example, ageing effects of the first laser or the laser arrangement or misalignment of the components of the laser-based light source.

The optical sensor or sensors can be combined with any embodiment of the laser-based light source described above or below.

The conversion device may comprise a prismatic surface for matching the first main emission direction of the first light to the second main emission direction of the reflected second part of the first laser light. The first main emission direction is locally always perpendicular to the first surface or surfaces of the conversion device as described above. In addition the averted surface or surfaces of the prismatic surface which do not receive the first laser light emit first light in the same way as the first surface or surfaces reflecting a second part of the first laser light. The combined emission of first light by means of the first surface or surfaces respectively the adverted surface or surface may therefore preferably direct essentially in the same direction as the reflected first laser light. The angle of incidence should thus be smaller than the Brewster angle but still enabling sufficient color control. A cross-section of an orthogonal to the prismatic structure may locally have a triangular shape. The triangles are preferably equilateral, wherein the two angles at the base of the triangles are preferably in the range between 25° and 35° more preferably in a range between 27.5° to 32.5° and most preferably 30° in order to enable matching of the first main emission direction of the first light to the second main emission direction of the reflected second part of the first laser light in combination with a corresponding angle of incidence with respect to the first surface or surfaces which is preferably in the range between 25° and 35° more preferably in a range between 27.5° to 32.5° and most preferably 30°.

The first surface of the conversion device may be adapted to spread the reflected second part of the first laser light. The first surface of the conversion device may, for example, be curved in order to spread the reflected second part of the first laser light. The curvature of the first surface may therefore be convex in at least one direction. Furthermore, there may be a prismatic structure at the first surface of the conversion device as described above. The prismatic structure may also be curved in order to spread the reflected second part of the first laser light. Alternatively or in addition may the first surface be characterized by a defined surface roughness. The surface roughness causes to a certain extent undefined angles of incidence of the first laser light. The surface roughness has therefore to be chosen in a way that the reflected second part of the first laser light is spread but that there is still the possibility to control the ratio between reflected and converted first laser light in a sufficient way.

The laser-based light source may further comprise an interface for receiving control signals. The manipulation device may be further adapted to manipulate or control the first intensity of the first light and the second intensity of the reflected second part of the first laser light by taking into account the control signals. The interface may be a wired or wireless interface. The interface may be adapted to receive measurement signals provided by means of external sensors, for example, a camera detecting the light emitted by the laser-based light source. The measurement signals may be used by means of the manipulation device to control the color, color distribution, intensity, intensity distribution and the like of the light emitted by the laser-based light source.

The manipulation device may act in this case as the master. Alternatively, it may be possible to transmit measurement results to an external unit (e.g. an external light emission control device) and receive control signals taking into account the measurement results and optionally measurement results of other external sensors. The manipulation device would in this case act as a slave.

According to a further aspect a vehicle headlight is provided. The vehicle headlight comprises at least one laser-based light source as described above. The vehicle headlight may comprise two, three, four or more laser-based light sources as described above. Each of the laser-based light sources may be controlled independently by means of the respective manipulation device as described above. Light emitted by a first laser-based light source comprised by the vehicle headlight may overlap with light emitted by a second laser-based light source comprised by the same vehicle headlight. The overlap may be used to manipulate or control the color point, color distribution, intensity and intensity distribution of the total light emitted by the vehicle headlight within a certain solid angle by means of the different manipulation devices of the laser-based light sources. Inhomogeneity of the light emitted by the first laser-based light which may be caused by the different first and second main emission directions as described above may therefore at least partly be compensated by means of a second, third or more laser-based light sources which emit light in the same solid angle. One or more optical sensors may be used to provide measurements results to manipulate or control the emission pattern of the headlight by means of the different manipulation devices. The combination of two, three, four or more laser-based light sources may also be used for other lighting devices.

According to a further aspect a lighting system is provided. The lighting system comprises at least two vehicle headlights as described above and at least one light emission control device. The light emission control device is adapted to submit control signals to the laser based light sources. The light pattern emitted by the vehicle headlights of the lighting system may be at least partly controlled by means of the manipulation devices of the laser-based light sources comprised by the vehicle headlights. The emission control device may use measurement data provided by one or more optical sensor integrated in the laser-based light sources. The emission control device may alternatively or in addition comprise an interface to receive further measurement data from external sensors or devices in order to generate the control signals. Such external sensors may be a camera system or any other optical, acoustic or radar sensors which may be used to control the light output of the lighting system.

According to a further aspect a method of light emission manipulation or control especially of color point adjustment is provided. The method comprises the steps of:

emitting first laser light by means of one or more lasers to a conversion device, wherein the first laser light comprises linearly polarized laser light with a first polarization component parallel to a plane of incidence of the first laser light with respect to a first surface of the conversion device and a second polarization component perpendicular to the plane of incidence, converting a first part of the first laser light to first light by means of the conversion device, reflecting a second part of the first laser light at the first surface of the conversion device, wherein the first light is in a different wavelength range as the first laser light, and manipulating or controlling a first intensity of the first part and a second intensity of the second part using an angular dependence of the reflection of the first and the second polarization component of the first laser light at the first surface of the conversion device.

The steps of the method are not necessarily performed in the order as presented above.

According to a further aspect is a computer program product provided. The computer program product comprises code means which can be saved on at least one first memory device comprised by the laser-based light source described above and/or on at least one second memory device comprised by the lighting system as described above. The code means are arranged such that the method as described above can be executed by means of at least one first processing device comprised by the laser-based light source as described above and/or on at least one second processing device comprised by the lighting system as described above.

The first or second memory device may comprise one or more memory modules as, for example, memory chips. The first or second processing device may comprise one or more processors or microprocessors.

It shall be understood that the laser light source according to any one of claims 1 to 11 and the method of claim 14 have similar and/or identical embodiments, in particular, as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first laser-based light source

FIG. 2 shows the reflectivity of a YAG surface for polarized light over angle

FIG. 3 shows a principal sketch of a second laser-based light source

FIG. 4 shows a principal sketch of a third laser-based light source

FIG. 5 shows a principal sketch of a cross-section of a first conversion device

FIG. 6 shows a principal sketch of a top view of a second conversion device

FIG. 7 shows a principal sketch of a top view of a third conversion device

FIG. 8 shows a principal sketch of a fourth laser-based light source

FIG. 9 shows a principal sketch of a fifth laser-based light source

FIG. 10 shows a principal sketch of a vehicle headlight

FIG. 11 shows a principal sketch of a lighting system

Figure 12:
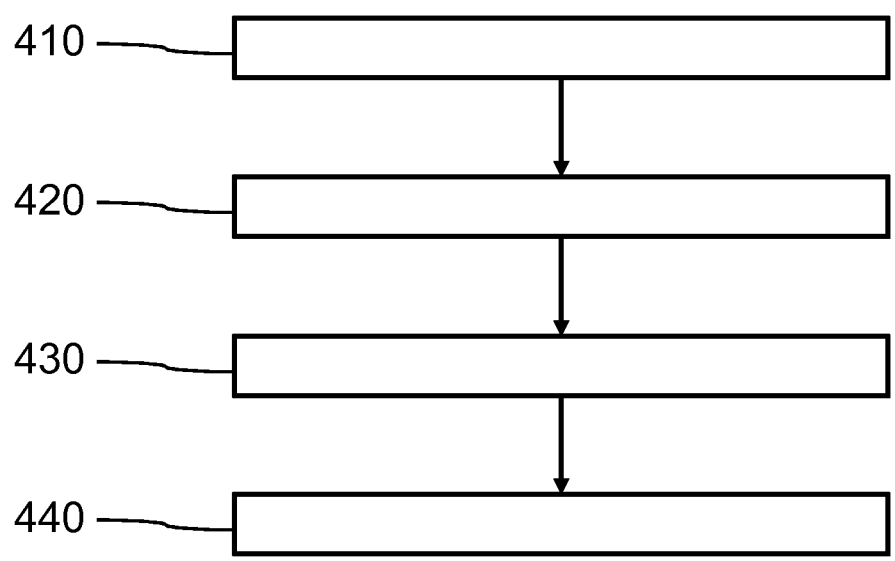

FIG. 12 shows a principal sketch of a method of light emission control

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
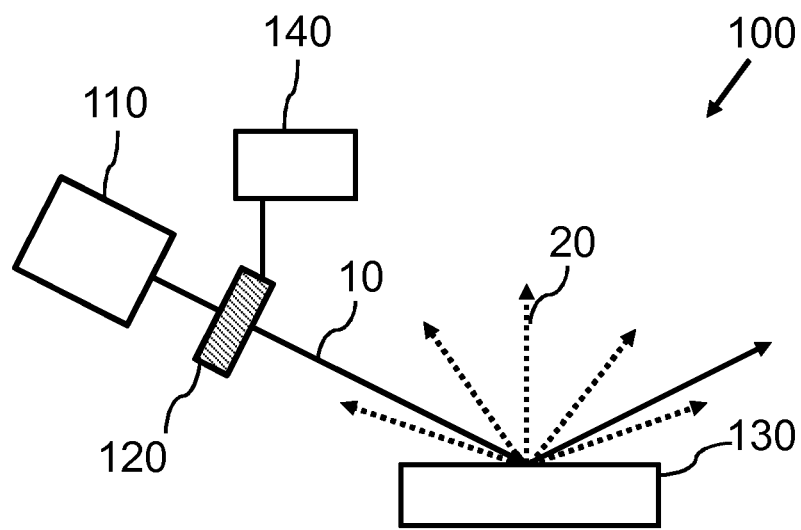

FIG. 1 shows a principal sketch of a first laser-based light source 100. The laser-based light source 100 comprises a first laser 110, a conversion device 130 and a manipulation device. The manipulation device comprises a controller 140 and optical manipulation device 120. The controller 140 comprises a microprocessor and a memory chip which are not shown. The optical manipulation device 120 comprises a liquid-crystal polarization rotator which is controlled by means of the controller 140. The first laser 110 comprises a solid state lasers emitting polarized first laser light 10 in the blue wavelength range. The polarization direction of the first laser light 10 can be controlled by means of the liquid-crystal polarization rotator. The first laser light 10 hits a planar first surface of the conversion device 130 at a defined angle of incidence. The conversion device comprises a rectangular sheet of Cerium doped YAG. A first part of the first laser light 10 enters the YAG ceramic and is converted to first light in the yellow wavelength range. A second part of the first laser light 10 is reflected at the first surface of the YAG ceramic. The ratio between the first and the second part of the first laser light 10 can be controlled by means of the polarization direction of the first laser light with respect to the plane of incidence of the first laser light 10 with respect to the first surface of the YAG ceramic as will be explained by means of FIG. 2.

Figure 2:
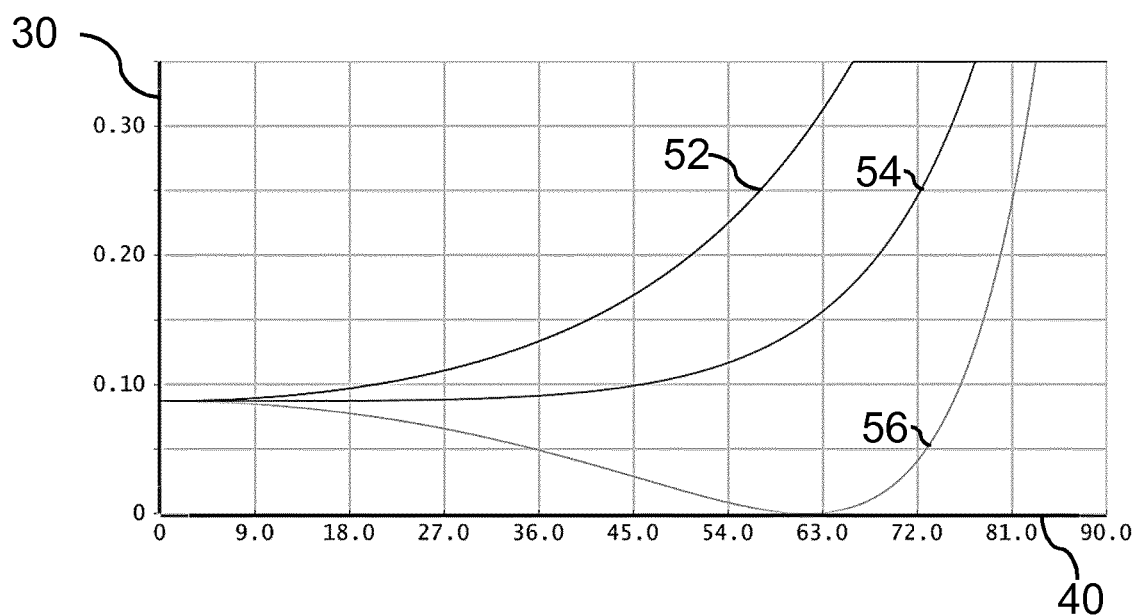

FIG. 2 shows the reflectivity of a YAG surface for polarized light over angle. The X-axis shows the angle of incidence 40 and the Y-axis shows the reflection intensity 30. The curve 52 shows reflected intensity of first laser light 10 with a polarization orthogonal to the plane of incidence (S-polarization). The curve 56 shows a reflected intensity of first laser light 10 with a polarization parallel to the plane of incidence (P-polarization). The curve 54 shows a reflected intensity of first laser light with average polarization (balanced mixture of S-polarization and P-polarization). First laser light 10 with P-polarization is not reflected at the Brewster angle of around 63° (angle with respect to the normal of the reflective surface). The total reflection of the first laser light can therefore be influenced by changing a ratio between the S-polarization and the P-polarization at a fixed angle of incidence, wherein the angle of incidence is chosen out of a range a range between around 15° and around 83°. Furthermore it is possible to influence the reflected intensity by means of the angle of incidence at a given polarization direction. Finally it is possible to use the polarization and the angle of incidence in order to control reflection at the first surface of the conversion device 130.

Figure 3:
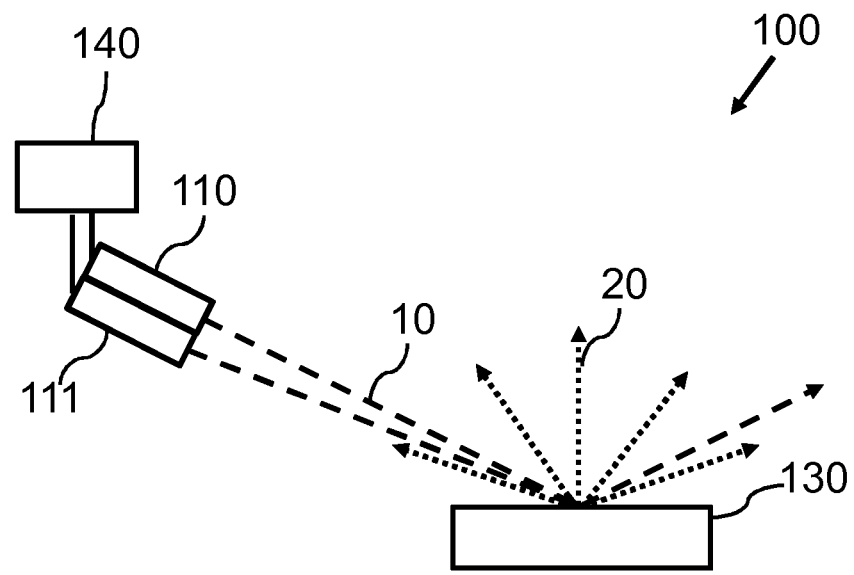

FIG. 3 shows a principal sketch of a second laser-based light source 100. The configuration is very similar to the configuration of the first laser-based light source shown in FIG. 1. The laser-based light source 100 comprises in addition to the first laser 110 a second laser 111, wherein the first and the second lasers 110, 111 emit the first laser light 10. The first laser 110 and the second laser 111 emit laser light with different polarization directions. The manipulation device comprises in this case a controller 140 (electrical power controller). The controller 140 is adapted to manipulate the first laser light 10 by adapting the electrical power submitted to the first laser 110 and/or the second laser 111. The intensity of the different polarization components comprised by the first laser light 10 can therefore be adapted by means of the electrical power submitted to the first laser 110 and the second laser 111.

Figure 4:
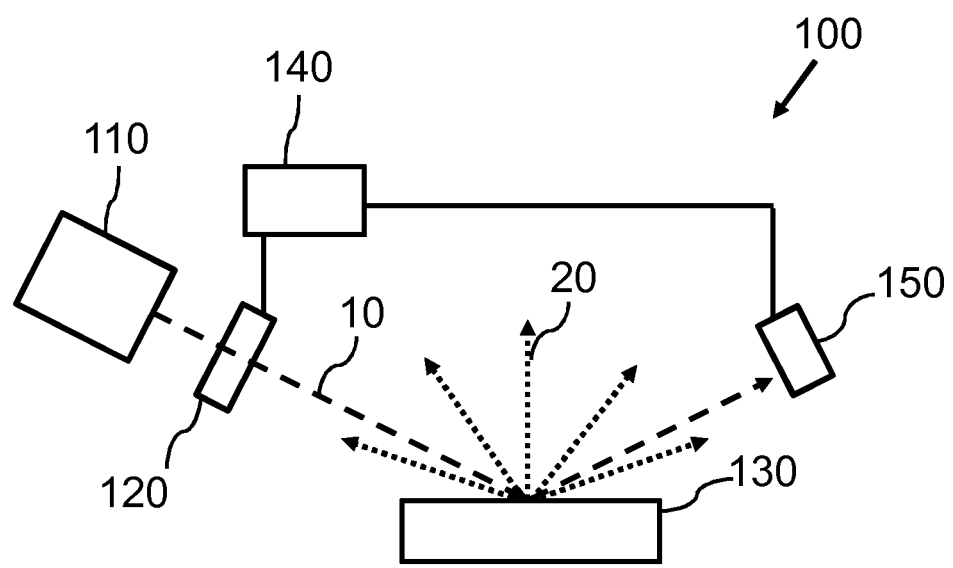

FIG. 4 shows a principal sketch of a third laser-based light source 100. The configuration is very similar to the configuration of the first laser-based light source shown in FIG. 1. The optical manipulation device 120 comprises in this case a half wave plate which can be rotated by means of an electrical motor mechanically coupled with the half wave plate in order to change the polarization direction of the first laser light 10. In addition to the configuration shown in FIG. 1 there is an optical sensor 150 which receives first light 20 and reflected first laser light 10 in a defined solid angle. The optical sensor 150 is in this case adapted to measure the color of the light in the defined solid angle and provides measurements results to controller 140 such that the controller can adapt polarization direction in order to get a predefined color distribution at the solid angle covered by optical sensor 150.

Figure 5:
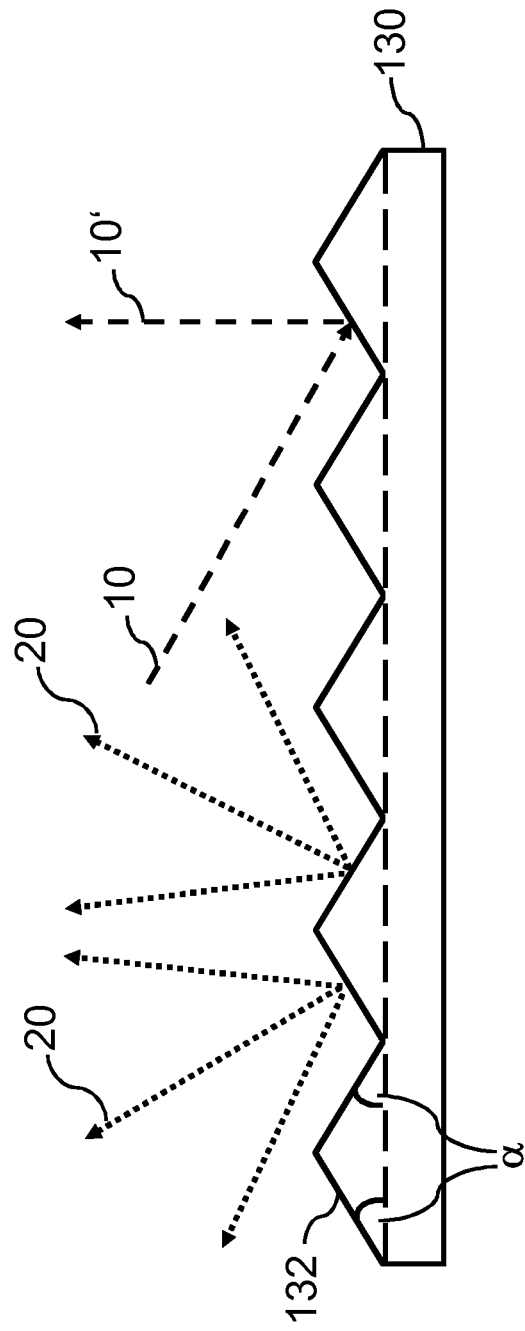

FIG. 5 shows a principal sketch of a cross-section of a first conversion device 130. The conversion device 130 consists of doped YAG with a prismatic surface 132. The cross-section of the prismatic surface 132 has a triangular shape. The facing sides (first surfaces) of the triangles are directed to the first laser 110 in order to reflect the second part of the first laser light 10 (reflected first laser light 10'). The cross-section shows equilateral triangles with two angles of around 30° with respect to the flat base of the conversion device 130. The other averted sides of the triangles which do not receive any first laser light also emit first light which is generated by means of the conversion of the first part of the first laser light 10 within the YAG material. Such emission is wanted in order to match the first main emission direction of the first light 10 to the second main emission direction of the reflected second part of the first laser light 10'. The first main emission direction of the first light 10 is given by the superposition of emission of first light 20 by means of the facing size (first surfaces) of the triangles and the first light 20 emitted by the averted sides.

Figure 6:
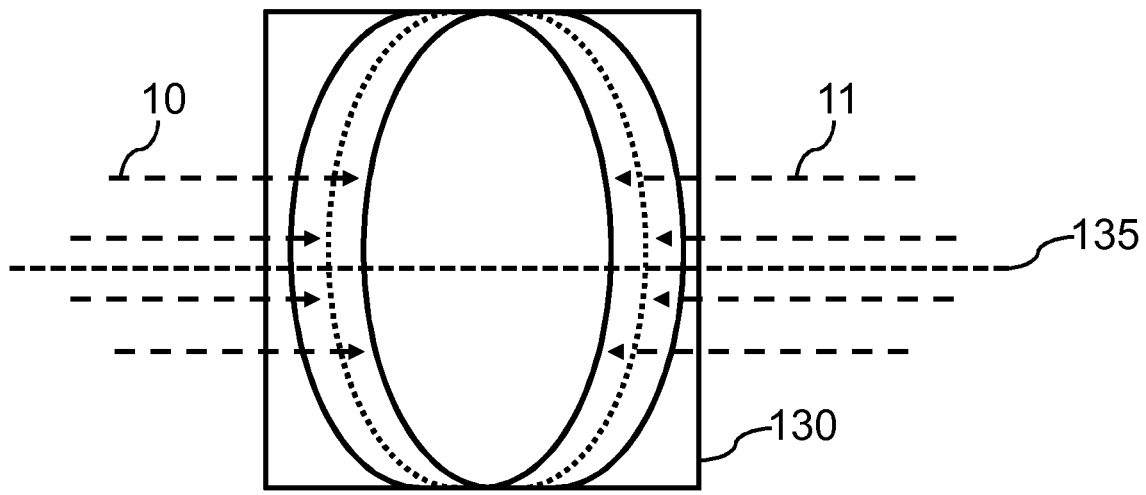

FIG. 6 shows a principal sketch of a top view of a second conversion device 130. Cutting line 135 indicates a line at which the cross-section shown in FIG. 5 has been made. Taking, for example, the left side of the conversion device 130 the cross-section would look like the one shown in FIG. 5. The right side of the conversion device 130 is a mirrored version of the left side such that first laser light 10 of the first laser 110 can be received at the left side and second laser light 11 of a second laser can be received at the right side. The second conversion device 130 differs from the first conversion device as shown in FIG. 5 in that the prismatic surfaces 132 as shown in FIG. 5 is straight wherein the prismatic surfaces as shown in FIG. 6 are curved. The cross-section of the first conversion device 130 in FIG. 5 is thus everywhere the same wherein the cross-section of the second conversion device 130 shown in FIG. 6 changes when cutting line 135 is shifted in parallel. The curvature of the prismatic surfaces does have the effect that the reflected first laser light and the reflected second laser light are spread. The prismatic surfaces act at least in one direction as a convex mirror. Such a configuration may especially be beneficial if such a laser-based light source 100 is used within an automotive headlight.

Figure 7:
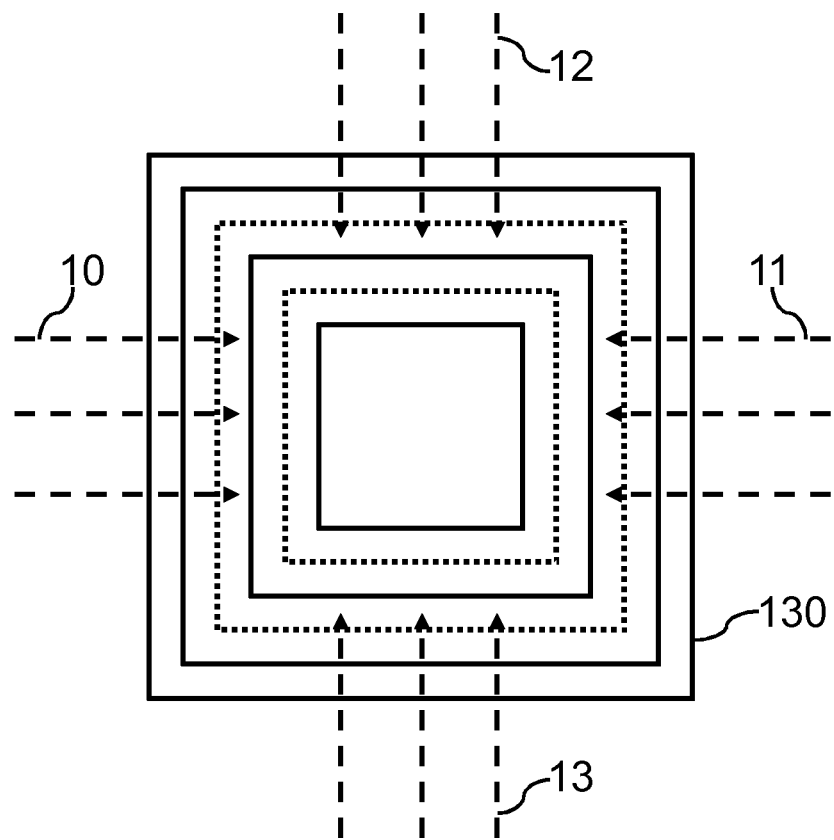

FIG. 7 shows a principal sketch of a top view of a third conversion device 130. The configuration is again similar as the first conversion device 130 shown in FIG. 5. The prismatic surfaces are not curved in this case as discussed with respect to FIG. 6 but straight as shown in FIG. 5. The third conversion device 130 is arranged such that the prismatic surfaces are arranged in a quadratic or more general rectangular configuration such that first laser light 10 of the first laser 110, second laser light 11 of the second laser, third laser light 12 of a third laser and fourth laser light 13 of the fourth laser can be converted and reflected. The first laser 110, second laser, third laser and fourth laser are in this case arranged in a rectangular arrangement directing the laser beams to the respective prismatic surfaces of the conversion device 130. The prismatic surfaces are arranged such that each of the prismatic surfaces comprises one axis which is orthogonal to the laser beams or light emitted by the respective laser. The first laser light 10, second laser light 11, third laser light 12 and fourth laser light 13 which is reflected at the prismatic surfaces is preferably directed orthogonal to the top view, as indicated in FIG. 5 with respect to the reflected first laser light 10'.

Figure 8:
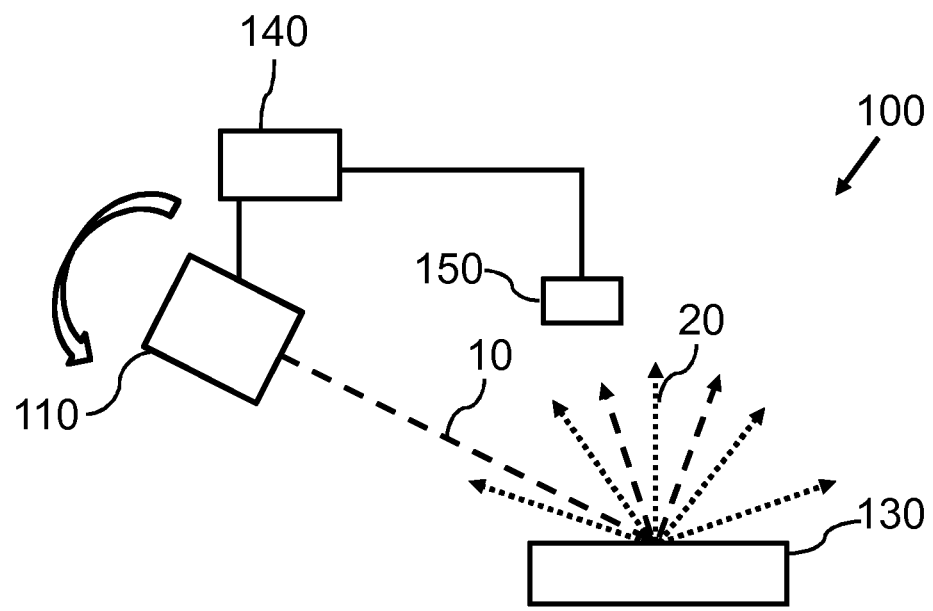

FIG. 8 shows a principal sketch of a third laser-based light source 100. The laser-based light source 100 comprises a first laser 110, a conversion device 130 and a manipulation device. The manipulation device comprises a controller 140 and mechanical manipulation device coupled to the first laser 110. The controller 140 comprises a microprocessor and a memory chip which are not shown. The first laser 110 comprises an edge emitting solid state laser emitting polarized first laser light 10 in the blue wavelength range. The polarization direction of the first laser light 10 can be controlled by means of the mechanical manipulation device which is adapted to turn the first laser 110 around the optical axis. The first laser light hits a planar first surface of the conversion device 130 at a defined angle of incidence. The conversion device comprises a rectangular sheet of Cerium doped YAG. A first part of the first laser light 10 enters the YAG ceramic and is converted to first light in the yellow wavelength range. A second part of the first laser light 10 is reflected at the first surface of the YAG ceramic. The ratio between the first and the second part of the first laser light 10 can be controlled by means of the polarization direction which is controlled by means of the controller 140 and the mechanical manipulation device. The laser-based light source 100 further comprises an optical sensor 150. The optical sensor 150 receives first light 20 and reflected first laser light 10' in a defined solid angle. The optical sensor 150 is in this case adapted to measure the color and the brightness of the light in the defined solid angle and provides measurements results to controller 140 such that the controller can adapt polarization direction by turning the first laser 110 in order to get a predefined color and brightness distribution at the solid angle covered by optical sensor 150.

Figure 9:
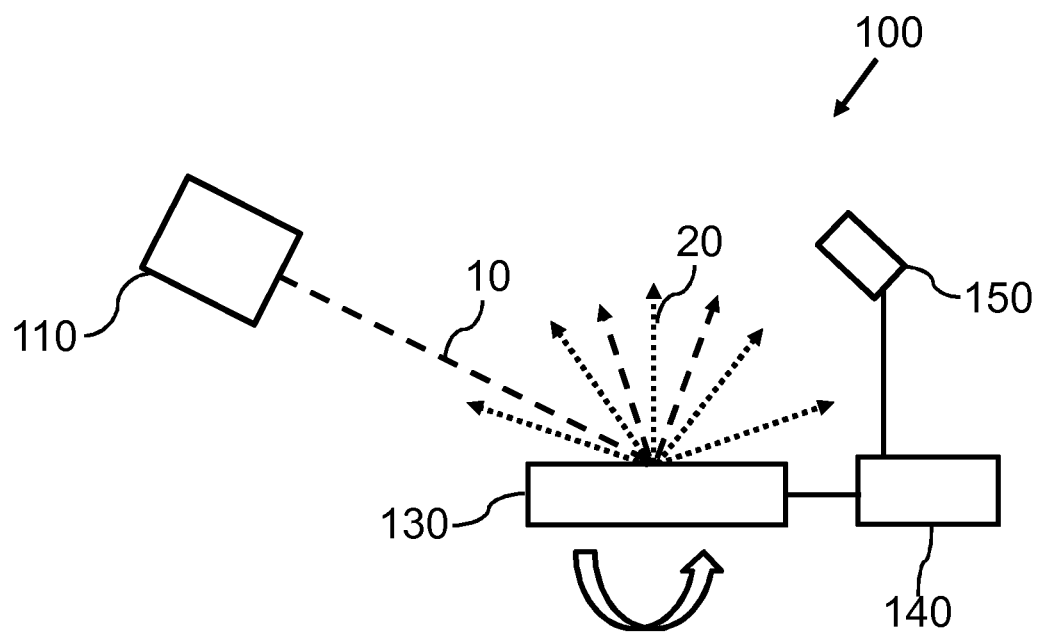

FIG. 9 shows a principal sketch of a fourth laser-based light source 100. The laser-based light source 100 comprises a first laser 110, a conversion device 130 and a manipulation device. The manipulation device comprises a controller 140 and mechanical manipulation device coupled to the conversion device 130. The controller 140 comprises a microprocessor and a memory chip which are not shown. The first laser 110 comprises an edge emitting solid state laser emitting polarized first laser light 10 in the blue wavelength range. The angle of incidence of the first laser light 10 with respect to the first surface of the conversion device 130 can be controlled by means of the mechanical manipulation device which is adapted to move the conversion device or at least a part thereof around an axis which is perpendicular to the plane of incidence within the plane of the cross-section. The conversion device comprises a multitude of rectangular sheets of conversion elements. A first part of the first laser light 10 enters the conversion elements and is converted to first light in the yellow wavelength range. A second part of the first laser light 10 is reflected at the first surfaces of the conversion elements. The ratio between the first and the second part of the first laser light 10 can be controlled by means of the angle of incidence which is controlled by means of the controller 140 and the mechanical manipulation device. The laser-based light source 100 further comprises an optical sensor 150. The optical sensor 150 receives first light 20 and reflected first laser light 10' in a defined solid angle. The optical sensor 150 is in this case adapted to measure the color and the brightness of the light in the defined solid angle and provides measurements results to controller 140 such that the controller can adapt angle of incidence by turning the conversion device 130 in order to get a predefined color and brightness distribution at the solid angle covered by optical sensor 150.

Each of the laser-based light sources 100 described above may comprise an optical device which is arranged to destroy coherence of the reflected laser light to enable sufficient eye safety and avoid speckle.

Figure 10:
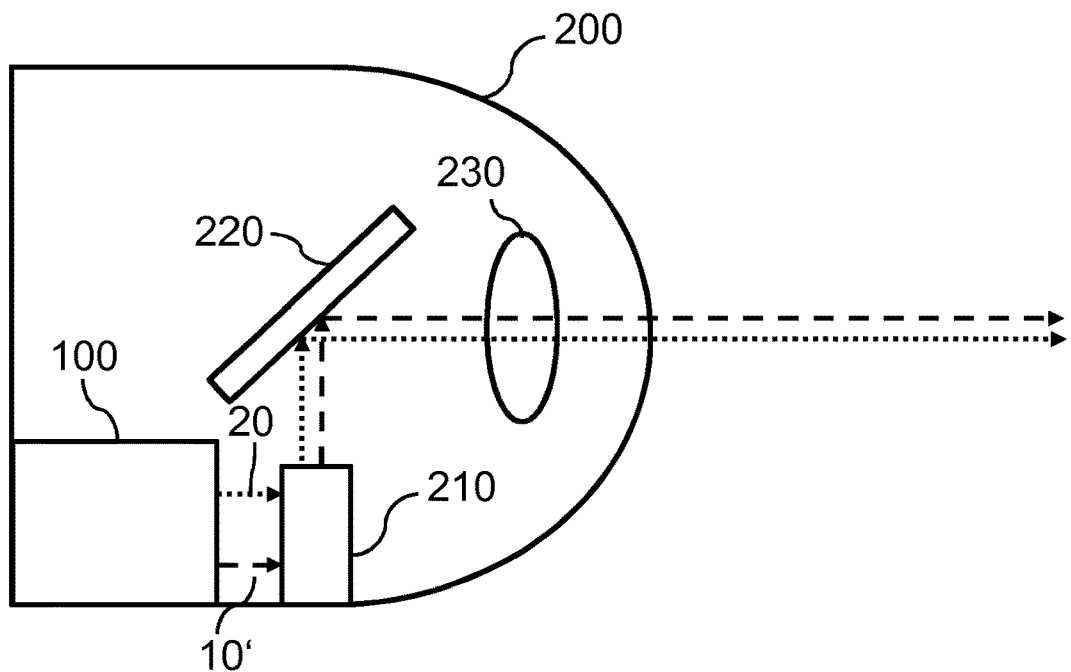

FIG. 10 shows a principal sketch of a vehicle headlight 200. The vehicle headlight 200 comprises a laser-based light source 100 emitting first light 20 and reflected first laser light 10'. The vehicle headlight 200 further comprises an optical mixer 210, a first mirror 220 and a first lens 230. The emitted light is mixed by means of optical mixer device 210 and redirected to the first mirror 220. The first mirror 220 reflects the emitted light in the direction of the first lens 230 in order to illuminate a defined section of, for example, a street. The illumination pattern emitted by the vehicle headlight 200 may be controlled by means of the controller 140 which is comprised by the laser-based light source. The vehicle headlight 200 may further comprise adaptable shutters, further lenses and other optical elements which may be used to illuminate the desired region in an adaptive way. The vehicle headlight 200 may in an alternative embodiment comprise two, three, four or more laser-based light sources 100 which can preferably be individually controlled. The laser-based light sources 100 may comprise one, two, three, four or more lasers in order to emit light of high brightness. The vehicle headlight 200 may further comprise an optical device which is arranged to destroy coherence of the reflected laser light to enable sufficient eye safety of the vehicle headlight. Such an optical device may be integrated in optical mixer device 210 or the first mirror 220 which may comprise a diffuse reflecting surface. Such an optical device may be further used in order to avoid speckle effects which may cause inhomogeneous light emission of the laser-based light source.

Figure 11:
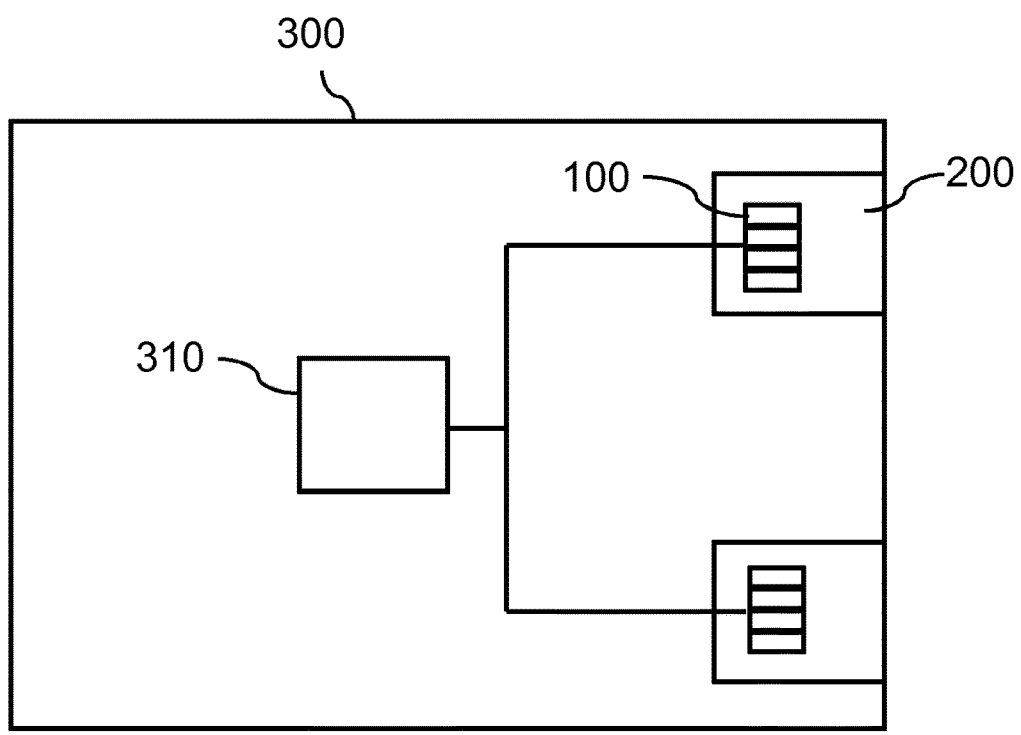

FIG. 11 shows a principal sketch of a lighting system which is integrated in a vehicle 300. The lighting system comprises two vehicle headlights 200 comprising a multitude of laser based light sources 100. The lighting system further comprises a light emission control device 310 which is coupled to the vehicle headlights 200. The light emission control device 310 comprises an interface (not shown) for receiving sensor data provided by other sensors of the vehicle, the optical sensors 150 of the laser-based light sources 100 and, for example, navigation data in order to generate control signals which are transferred to the controller of the laser-based light sources 100. The controllers 140 of the laser-based light sources 100 are in this cased configured to transfer measurement data received from the optical sensors 150 to the light emission control device 310. The laser-based light sources 100 of the vehicle headlights 200 are controlled based on the control signals provided by the light emission control device 310 by means of the controllers 140 and the corresponding manipulation devices. It may be possible to transfer most of the functionalities of the controllers 140 in the light emission control device 310 such that the controllers 140 would simply execute the commands of the light emission control device 310 by providing, for example, electrical signals to adjust emission of the laser-based light sources 100.

FIG. 12 shows a principal sketch of a method of light emission control. In step 410 is first laser light 10 emitted by means of a first laser 110. The first laser light 10 is emitted to a conversion device 130, wherein the first laser light 10 comprises linearly polarized laser light with a first polarization component parallel to a plane of incidence of the first laser light 10 with respect to a first surface of the conversion device 130 and a second polarization component perpendicular to the plane of incidence. A first part of the first laser light is in step 420 converted by means of the conversion device 130 to first light 20. In step 430 is a second part of the first laser light 10 reflected at the first surface of the conversion device 130. The first light 20 is in a different wavelength range as the first laser light 10. A first intensity of the first part and a second intensity of the second part is controlled in step 440 using an angular dependence of the reflection of the first and the second polarization component of the first laser light 10 at the first surface of the conversion device 130.

It is a basic idea of the present invention to use the angular dependence of the reflection of polarized laser light 10 at a surface of the conversion material to control especially the color point of light emitted by means of a laser-based light source 100. The reflected laser light is in a first wavelength range and the converted light is in a second wavelength range different from the first wavelength range such that the color point of the light emitted by means of the laser-based light source 100 in a defined solid angle depends on the ratio between reflected and converted light. Several lasers within the laser-based light source 100 may be controlled independently. The latter may enable a homogeneous light emission in a wide range of the emission pattern.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 first laser light
11 second laser light
12 third laser light
13 fourth laser light
20 first light
30 reflection intensity
40 angle of incidence
52 reflected intensity of first laser light with s-polarization
54 average reflected intensity of first laser light
56 reflected intensity of first laser light with p-polarization
100 laser-based light source
110 first laser 111 second laser
120 optical manipulation device
130 conversion device
132 prismatic surface
135 cutting line
140 controller
150 optical sensor
200 automotive headlight
210 optical mixer device
220 first mirror
230 first lens
300 vehicle
310 light emission control device
410 step of emitting first laser light
420 step of converting first laser light
430 step of reflecting first laser light
440 step of controlling intensity

The invention claimed is:

1. A laser-based light source comprising at least one or more lasers, at least one conversion device and at least one manipulation device, wherein the one or more lasers are adapted to emit first laser light, wherein the first laser light comprises linearly polarized laser light with a first polarization component parallel to a plane of incidence of the first laser light with respect to a first surface of the conversion device and a second polarization component perpendicular to the plane of incidence, wherein the conversion device is adapted to convert a first part of the first laser light to first light and to reflect a second part of the first laser light at the first surface of the conversion device, wherein the first light is in a different wavelength range as the first laser light, and wherein the manipulation device is arranged to manipulate a first intensity of the first part and a second intensity of the second part using an angular dependence of the reflection of the first and the second polarization component of the first laser light at the first surface of the conversion device.

2. The laser-based light source according to claim 1, wherein the one or more lasers comprise at least a first laser and a second laser, wherein the first laser and the second laser are adapted to emit the first laser light.

3. The laser-based light source according to claim 1, wherein the one or more lasers comprise a first laser, wherein the first laser is adapted to emit the first laser light.

4. The laser-based light source according to claim 1, wherein the first surface of the conversion device is adapted to match a first main emission direction of the first light to a second main emission direction of the second part of the first laser light.

5. The laser-based light source according to claim 4, wherein the conversion device comprises a prismatic surface for matching the first main emission direction of the first light to the second main emission direction of the reflected second part of the first laser light.

6. The laser-based light source according to claim 1, wherein the manipulation device is arranged to manipulate the first intensity of the first part and the second intensity of the second part by changing a ratio between the first polarization component and the second polarization component.

7. The laser-based light source according to claim 6, wherein the manipulation device comprises a controller and an optical manipulation device, wherein the optical manipulation device comprises a half wave plate and a rotation unit, wherein the controller is adapted to change the ratio between the first polarization component and the second polarization component by rotating the half wave plate by means of the rotation unit.

8. The laser-based light source according to claim 6, wherein the manipulation device comprises a controller and an optical manipulation device, wherein the optical manipulation device comprises an electro-optical rotator, wherein the controller is adapted to change the ratio between the first polarization component and the second polarization component by means of the electro-optical rotator.

9. The laser-based light source according to claim 6, wherein the manipulation device comprises a controller and a first movement unit mechanically coupled to one or more lasers, wherein the controller is adapted to change the ratio between the first polarization component and the second polarization component by moving the one or more laser by means of the first movement unit.

10. The laser-based light source according to claim 1, wherein the manipulation device is arranged to manipulate the first intensity of the first part and the second intensity of the second part by changing an angle of incidence of the first laser light with respect to the first surface of the conversion device.

11. The laser-based light source according to claim 1, the laser-based light source further comprising at least one optical sensor, wherein the optical sensor is arranged to measure a brightness or color of the first light and the reflected second part of the first laser light in at least one predefined solid angle in a light emission direction of the laser-based light source, wherein the manipulation device is adapted to receive measurement signals based on the brightness or color measured by the optical sensor, and wherein the manipulation device is arranged to manipulate the first intensity of the first part and the second intensity of the second part based on the received measurement signals.

12. A vehicle headlight comprising at least one laser-based light source according to claim 1.

13. A lighting system comprising at least two vehicle headlights according claim 12 and at least one light emission control device, wherein the light emission control device is adapted to submit control signals to the laser based light sources.

14. A computer program product comprising code which can be saved on at least one second memory device comprised by the lighting system according to claim 13, wherein the code is arranged such that light emitting manipulation can be executed by at least one second processing device comprised by the laser-based light source.

15. A computer program product comprising code means which can be saved on at least one first memory device comprised by the laser-based light source according to claim 1, wherein the code means is arranged such that light emitting manipulation can be executed by means of at least one first processing device comprised by the laser-based light source.

16. A method of light emission manipulation, the method comprising the steps of:
  emitting first laser light by means of one or more lasers to a conversion device, wherein the first laser light comprises linearly polarized laser light with a first polarization component parallel to a plane of incidence of the first laser light with respect to a first surface of the conversion device and a second polarization component perpendicular to the plane of incidence,
  converting a first part of the first laser light to first light by means of the conversion device,
  reflecting a second part of the first laser light at the first surface of the conversion device, wherein the first light is in a different wavelength range as the first laser light, and manipulating a first intensity of the first part and a second intensity of the second part using an angular dependence of the reflection of the first and the second polarization component of the first laser light at the first surface of the conversion device.

\* \* \* \* \*